United States Patent [19]
Charrier

[11] Patent Number: 5,929,759
[45] Date of Patent: Jul. 27, 1999

[54] PROXIMITY DETECTOR WITH RAPID RECEPTION AMPLIFICATION

[75] Inventor: Pierre Charrier, Migne-Auxances, France

[73] Assignee: Schneider Electric SA, Boulogne Billancourt, France

[21] Appl. No.: 08/985,910

[22] Filed: Dec. 5, 1997

[30] Foreign Application Priority Data

Dec. 5, 1996 [FR] France .................................. 96 15070

[51] Int. Cl.⁶ .................................................. G08B 13/18
[52] U.S. Cl. ..................... 340/555; 250/206; 250/214 A; 330/250; 330/296; 340/600
[58] Field of Search ..................... 340/555, 556, 340/600; 250/214 A, 206; 330/296, 250

[56] References Cited

FOREIGN PATENT DOCUMENTS

3518025 A1   11/1986   Germany .

OTHER PUBLICATIONS

Paul Horowitz, et al., "The Art of Electronics," Cambridge University Press, (1989), pp. 86–87.

Patent Abstracts of Japan, vol. 7, No. 38, (P–176), Feb. 16, 1983 and JP 57 191501 A, Nov. 25, 1982.

Primary Examiner—Glen Swann
Attorney, Agent, or Firm—Oblon, Spivak, McClelland, Maier & Neustadt, P.C.

[57] ABSTRACT

A proximity detector including a rapid transistor (i.e., one having a very high product gain-band) connected to a high potential voltage via a capacitor. The capacitor is connected in series to a source of a pulsed current that is a function of the proximity of an object. The capacitor is also connected to a low potential voltage via an RC circuit. The mid-point of the RC circuit is connected to the collector of a transistor connected to the high potential voltage by a collector resistor in parallel with a gain resistor of the amplifier.

3 Claims, 1 Drawing Sheet

PROXIMITY DETECTOR WITH RAPID RECEPTION AMPLIFICATION

BACKGROUND OF THE INVENTION

1. Field of the Invention

The present invention relates to a proximity detector, in particular a photoelectric cell provided with a reception amplifier that responds rapidly to pulses received.

2. Discussion of the Background

A photoelectric cell generally consists of an optical beam emitting assembly and an optical beam reception assembly. In response to electrical pulses produced by an electronic emission circuit an optoelectronic device emits optical pulses; an optoelectronic reception device receives a pulsed beam that is varied by the presence or absence of an object in the path of the emitted beam and generates corresponding current pulses. These pulses are processed by an electronic reception circuit to produce an output signal that is a switching signal delivered, for example, to a load.

It has been found that amplification of pulsed current received is too slow in the photoelectric cells known in the art. A simple, rapid method of amplifying the pulsed signals received is therefore required.

SUMMARY OF THE INVENTION

The purpose of the invention is to use simple, reasonably-priced means to provide rapid amplification of a pulsed signal received by a pulse-detecting proximity detector. It is a further purpose of the invention to adapt said rapid amplification to a differential processing system of the type used in background-excluding photoelectric cells.

According to the invention the electronic reception circuit that processes received pulses includes a transfer impedance load amplifier provided with a rapid transistor (i.e., one having a very high product gain-band) whose base is connected to a high potential via a capacitor connected in series with the source of the pulsed current, and to a low potential via a series-connected resistor-capacitor circuit, the midpoint of which is connected to the collector of the transistor between said collector and a collector resistor. A gain resistor is disposed in parallel with the collector resistor.

This assembly therefore detects received pulses rapidly using simple, low-consumption means.

The reception circuit preferably includes two more or less identical transfer impedance load amplifiers whose outputs are connected to a comparator in order to provide differential processing of received pulses.

The following description of a non-limitative embodiment gives more details of the invention and the results that can be obtained using it.

BRIEF DESCRIPTION OF THE PREFERRED EMBODIMENTS

FIG. 1 is a schematic diagram of the reception stage of a photoelectric cell according to the invention; and FIG. 2 is a diagram of a differential amplifier assembly in this type of stage.

DESCRIPTION OF THE PREFERRED EMBODIMENTS

Figure 1:
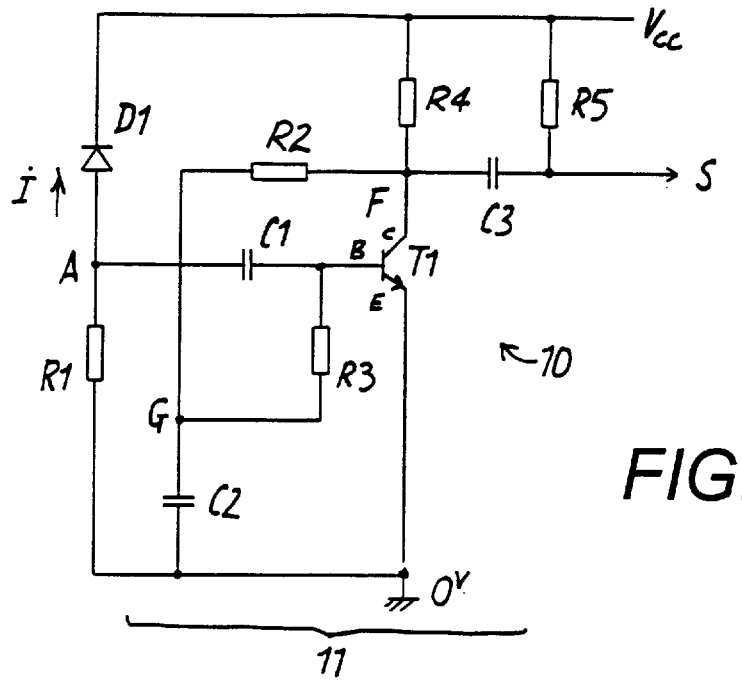

Reception stage 10 shown in FIG. 1 is included in a photoelectric cell that also includes an emitting circuit that activates a light-emitting device, causing it to emit optical pulses. Reception stage 10 consists of a light-receiving device D1, for example a diode, that receives optical pulses to provide a variable current source that reflects the presence or proximity of an object, for example, following reflection on the object of the emitted beam. Stage 10 comprises a transfer impedance load amplifier 11 whose output delivers the switching signal S of the cell. The example described can obviously be applied to proximity detectors other than photoelectric cells, such detectors operating by receiving current pulses signifying the proximity of the object.

Amplifier 11 includes a rapid bipolar transistor T1 whose collector C is connected via a collector resistor R4 to a high potential Vcc while its emitter E is connected to a low potential 0V. The cathode of light-receiving device D1 is connected to Vcc while its anode is connected to 0V via a resistor R1. The base of transistor T1 is connected via a capacitor C1 to a point A that is half way between D1 and R1. A point F half way between collector C of T1 and its collector resistor R4 is connected by means of a resistor R2 connected in series with a capacitor C2 to potential 0V. Base B of transistor T1 is connected via a resistor R3 to a point G half way between resistor R2 and capacitor C2. A resistor R5 acting as the gain resistor of the amplifier is disposed in parallel with resistor R4, being connected both to Vcc and to point F by a capacitor C3 and to the amplifier output.

The reception stage described operates as follows: transistor T1 of amplifier 11 is polarized in direct current (i.e., biased with DC voltage) via resistors R4, R2 and R3, with the high value of R4 acting to limit consumption of current. This consumption is much lower than that of the operational amplifiers commonly used in this type of assembly. When optical pulses are detected by device D1 a pulsed current I passes through D1, a small proportion of the current passing through R1 while the majority passes through C2, R3 and C1. Resistor R3 causes a dynamic increase in the potential of base B of transistor T1 which quickly starts operating in saturated mode. A rapid response to the pulses received is available at the output of amplifier 11. Said response appears as voltage signal S amplified with a gain determined by resistor R5 and constituting the switching signal of the cell. It should be noted that the combination of R2–C2 limits the influence of variations of voltage in the collector of transistor T1 on the polarization of the base of T1. It also ensures that the collector of T1 has a mean polarization point of approximately 1 Vbe, where Vbe is the voltage between base B and emitter E of transistor T1.

Figure 2:
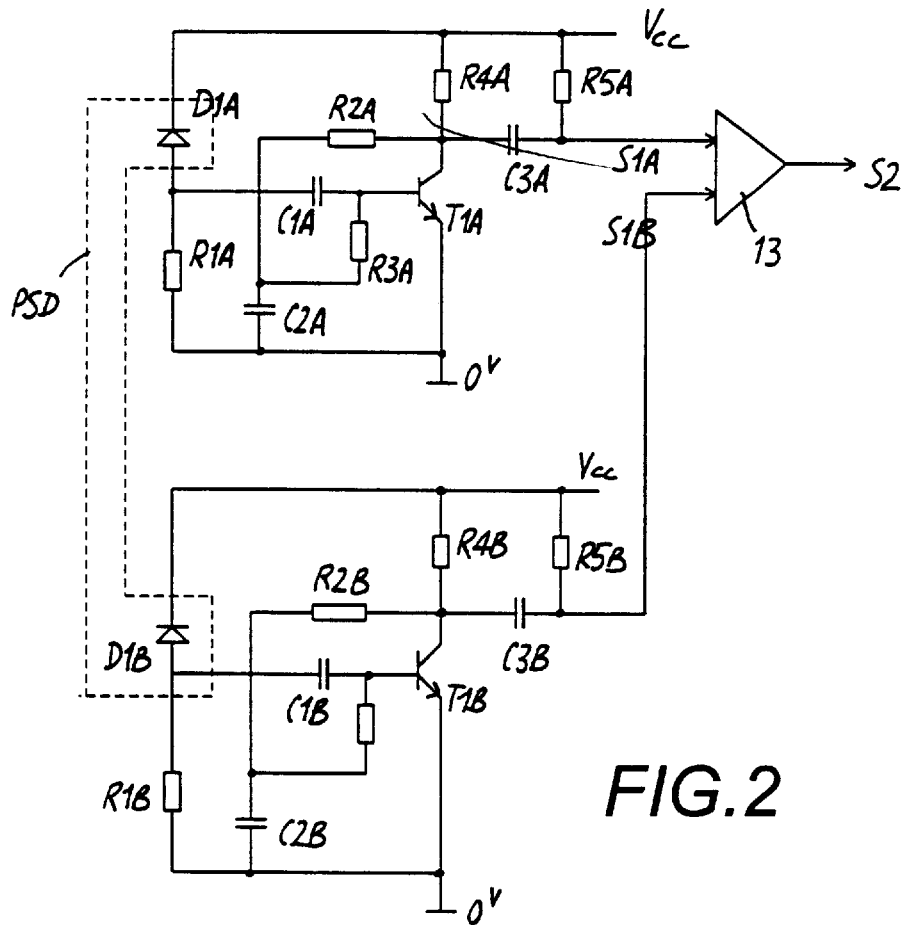

In the assembly shown in FIG. 2, which is well-suited for use in a differentially-processing photoelectric cell such as a background-excluding photoelectric cell, two amplifier stages like that described above are included. Identical components in the two stages are given the same references with the addition of the suffixes A and B. For example, current sources D1A and D1B of the two amplifiers belong to the same position sensitive device (PSD). Signals S1A and S1B, generated by amplifiers 11A and 11B respectively, are used differentially, being applied to the respective inputs of a comparator amplifier 13 that provides the switching signal S2 of the cell. The differential detection thereby achieved is rapid, uses a small number of components and is low in energy consumption.

What is claimed is:

1. A proximity detector, comprising:
   at least one reception device having a current source configured to convert pulses that are a function of the proximity of an object into current pulses;
   an electronic reception circuit configured to shape a switching signal from the current pulses, the reception circuit including a first transfer impedance load amplifier including a transistor having a collector and a base connected to a high voltage potential by a first capacitor connected in series with the source of the current pulses, said base also being connected to a low voltage potential by a first resistor connected in series to a second capacitor by a node, said node being connected to the collector of the transistor by a collector resistor; and a gain resistor disposed in parallel with the collector resistor.

2. The proximity detector of claim 1, further comprising;

a comparator; and a second transfer impedance load amplifier, wherein said current source is a first light receiving element of the first transfer impedence load amplifier, said first transfer impedence load amplifier includes a first output connected to the comparator, and the second transfer impedence load amplifier includes a second output and a second light receiving element connected to the comparator by the second output.

3. The proximity detector of claim 1, wherein the node is connected is connected to the collector by a second resistor, the second resistor and the second capacitor forming a filter configured to limit the influence that variations in voltage on the collector have on the polarization of the base.

* * * * *